US007178628B2

(12) United States Patent
Gordon

(10) Patent No.: US 7,178,628 B2
(45) Date of Patent: Feb. 20, 2007

(54) SPEAKER ASSEMBLY

(75) Inventor: Ryan Gordon, San Elijo Hills, CA (US)

(73) Assignee: Dana Innovations, Inc., San Clemente, CA (US)

( * ) Notice: Subject to any disclaimer, the term of this patent is extended or adjusted under 35 U.S.C. 154(b) by 303 days.

(21) Appl. No.: 10/821,063

(22) Filed: Apr. 8, 2004

(65) Prior Publication Data

US 2005/0224281 A1 Oct. 13, 2005

(51) Int. Cl.
*H04R 9/06* (2006.01)
*H04R 1/02* (2006.01)
*H04R 1/26* (2006.01)
*H05K 7/16* (2006.01)

(52) U.S. Cl. ...................... 181/153; 181/150; 381/386; 381/387; 381/336

(58) Field of Classification Search ................ 181/150, 181/153, 171, 173, 163, 144, 147, 154; 381/386, 381/387, 389, 182, 304, 305, 335, 336, 395, 381/188, 205, 155
See application file for complete search history.

(56) References Cited

U.S. PATENT DOCUMENTS

| | | | | |
|---|---|---|---|---|
| 5,133,428 | A * | 7/1992 | Perrson | 181/153 |
| 5,859,917 | A * | 1/1999 | Silber et al. | 381/389 |
| 6,026,927 | A | 2/2000 | Burdett et al. | |
| 6,070,694 | A * | 6/2000 | Burdett et al. | 181/150 |
| 6,101,262 | A * | 8/2000 | Haase et al. | 381/386 |
| 6,356,640 | B1 * | 3/2002 | Lin | 381/182 |
| 6,683,963 | B2 | 1/2004 | Sterns et al. | |
| 2003/0044039 | A1 * | 3/2003 | Sterns et al. | 381/386 |

FOREIGN PATENT DOCUMENTS

| | | |
|---|---|---|
| WO | WO 00/41434 | 7/2000 |

* cited by examiner

*Primary Examiner*—Lincoln Donovan
*Assistant Examiner*—Jeremy Luks
(74) *Attorney, Agent, or Firm*—Knobbe, Martens, Olson & Bear LLP

(57) ABSTRACT

A pivoting panel-mount speaker assembly comprises a speaker housing. The speaker housing has a perimeter flange portion, an exterior housing wall extending rearwardly from the perimeter flange portion, and an interior curved track extending rearwardly from the perimeter flange portion. The interior curved track has an outward facing convex surface and an inward facing concave surface. The speaker assembly further comprises a speaker unit having a transducer element and a speaker frame supporting the transducer element. The speaker frame has an outward facing surface configured to slidably engage the inward facing concave surface of the housing interior curved track. The speaker assembly further comprises a speaker support member attached to the speaker unit. The speaker support member also has an inward facing surface configured to slidably engage the outward facing convex surface of the housing interior curved track. The speaker assembly further comprises a circuit panel having speaker control circuitry mounted thereon. The circuit panel is mounted to the exterior housing wall at one or more circuit panel attachment points. The speaker unit and the speaker support member are pivotable around a pivot point that is forward of the transducer element.

50 Claims, 4 Drawing Sheets

SPEAKER ASSEMBLY

FIELD OF THE INVENTION

The present invention relates generally to a loudspeaker, and relates more specifically to a loudspeaker that is capable of pivoting relative to a stationary panel-mount housing.

BACKGROUND OF THE INVENTION

Speaker assemblies have been developed that are capable of being panel-mounted, thereby allowing the speaker assembly to be recessed within a panel, such as a wall, floor or ceiling panel. This configuration provides an aesthetically appealing appearance and consumes little physical space on the exterior side of the panel. To direct sounds in a particular direction, as can easily be done with conventional floor or cabinet speakers wherein the entire speaker system can be moved or repositioned at any time, pivotable panel-mounted speaker assemblies have been developed. In a pivotable panel-mounted speaker assembly, the sound emanating from a pivotable speaker can be redirected without repositioning the entire speaker housing, which remains stationary. Pivotable panel-mounted speaker assemblies having pivotable high-range and mid-range speakers have also been developed.

SUMMARY OF THE INVENTION

Conventional pivotable panel-mounted speaker assemblies, examples of which are provided above, suffer from certain disadvantages. For example, a conventional pivotable panel-mounted speaker assembly may have a recessed pivot point, such that when the speaker pivots, sound emanating from the speaker is reflected by the inner wall of the speaker housing. This reflection causes distortion of the sound waves, thus resulting in lower quality sound reproduction. Consequently, an improved panel-mounted pivotable speaker assembly that reduces sound reflection from the speaker housing has been developed.

In one embodiment of the present invention, a pivoting panel-mount speaker assembly comprises a speaker housing. The speaker housing has a perimeter flange portion, an exterior housing wall extending rearwardly from the perimeter flange portion, and an interior curved track extending rearwardly from the perimeter flange portion. The interior curved track has an outward facing convex surface and an inward facing concave surface. The speaker assembly further comprises a speaker unit having a transducer element and a speaker frame supporting the transducer element. The speaker frame has an outward facing surface configured to slidably engage the inward facing concave surface of the housing interior curved track. The speaker assembly further comprises a speaker support member attached to the speaker unit. The speaker support member also has an inward facing surface configured to slidably engage the outward facing convex surface of the housing interior curved track. The speaker assembly further comprises a circuit panel having speaker control circuitry mounted thereon. The circuit panel is mounted to the exterior housing wall at one or more circuit panel attachment points, for example via circuit panel attachment bosses. The speaker unit and the speaker support member are pivotable around a pivot point that is forward of the transducer element.

In another embodiment of the present invention, a speaker system comprises a speaker support unit configured support a first speaker. The speaker support unit has an interior support member and an exterior support member. The interior and exterior support members are separated by a gap. The speaker system further comprises a speaker housing having a pivot guide that is configured to be positioned in the gap between the speaker support unit interior and exterior support members. This allows the speaker support unit to pivot relative to the speaker housing. the speaker system further comprises an auxiliary support structure that is mounted to the speaker support unit. The auxiliary support structure is also configured to support a second speaker that is pivotable in the auxiliary support structure. The second speaker is positioned forward of the first speaker.

In another embodiment of the present invention, an apparatus comprises a speaker housing. The speaker housing has a curved track with an outward facing convex surface and an inward facing concave surface. The apparatus further comprises a speaker assembly configured to support a transducer element. The speaker assembly includes an outward facing surface configured to slidably engage the inward facing concave surface of the housing interior curved track. The apparatus further comprises a speaker support member attached to the speaker assembly. The speaker support member has an inward facing surface configured to slidably engage the outward facing convex surface of the housing interior curved track. The speaker assembly and the speaker support member are pivotable around a pivot point that is forward of the transducer element.

In another embodiment of the present invention, a method of assembling a speaker assembly comprises mounting a speaker support member to a main speaker unit. A gap is left between a inward facing engagement surface of the speaker support member and an outward facing engagement surface of the main speaker unit. The speaker support member supports a first speaker. The method further comprises positioning a speaker housing interior curved track portion of a speaker housing into at least a portion of the gap. An exterior side of the curved track portion engages the inward facing engagement surface, and an interior side of the curved track portion engages the outward facing engagement surface. The method further comprises mounting an auxiliary support structure to the speaker support member. The auxiliary support structure supports a second speaker forward of the first speaker.

In another embodiment of the present invention, a method comprises positioning a main speaker unit at least partially within a speaker housing. An outward facing surface of the main speaker unit slidably engages an inward facing concave surface of the speaker housing. The method further comprises pivoting the main speaker unit with respect to the speaker housing, such that the main speaker unit pivots about a pivot point that is not located within the speaker housing.

BRIEF DESCRIPTION OF THE DRAWINGS

Exemplary embodiments of the improved speaker assembly are illustrated in the accompanying drawings, which are for illustrative purposes only. The drawings comprise the following figures, in which like numerals indicate like parts.

DETAILED DESCRIPTION OF PREFERRED EMBODIMENTS

As set forth above, one embodiment provides a panel-mounted pivotable speaker assembly that reduces sound reflection from the speaker housing. This configuration provides improved sound quality with respect to conventional panel-mounted pivotable speaker assemblies. In particular, by providing a configuration where the speaker moves up and away from walls of the speaker housing when the speaker pivots, sound reflections from the speaker housing can be reduced, thereby improving overall sound quality.

Figure 1:
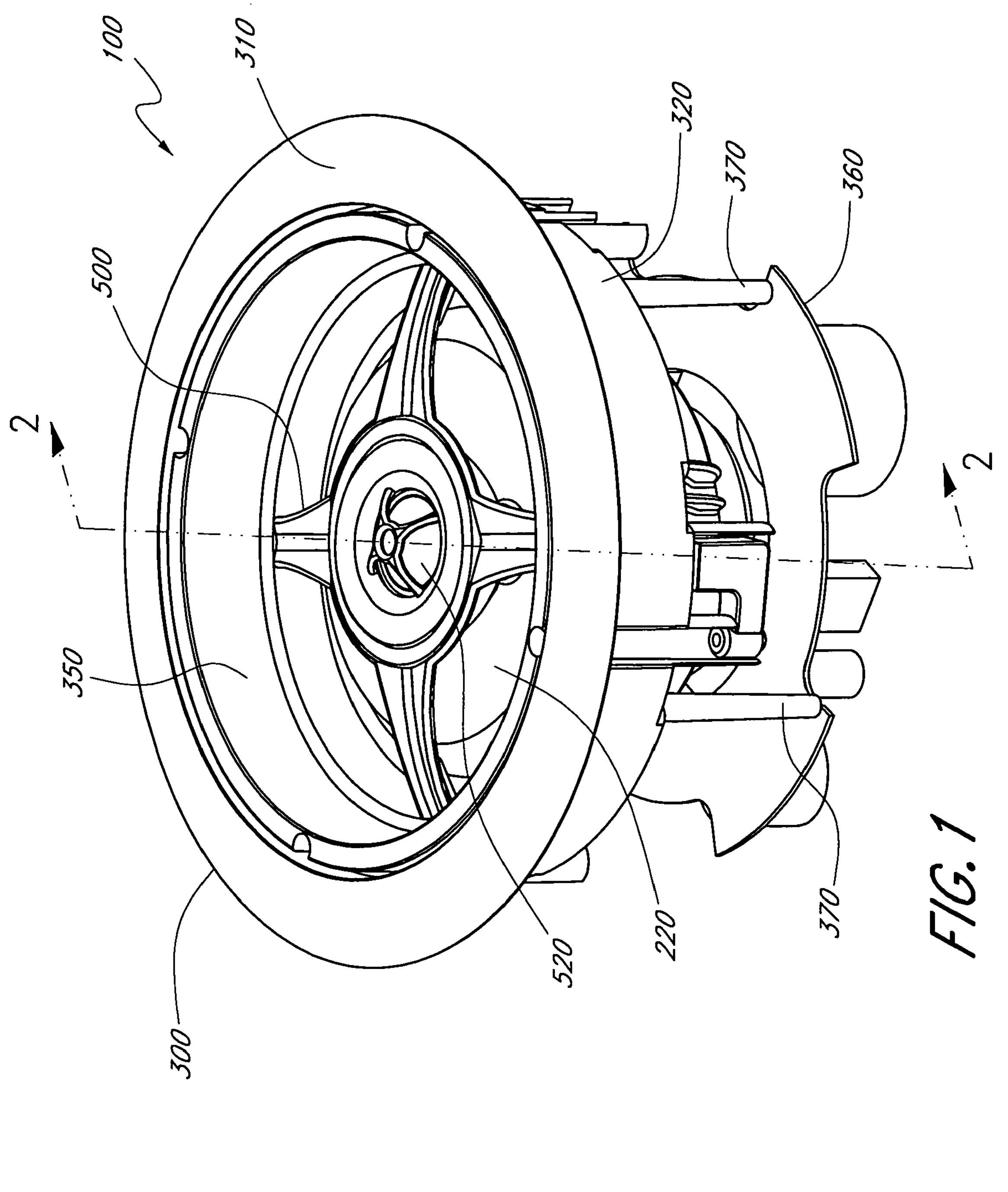
FIG. 1 is a perspective view of an exemplary embodiment of a panel-mounted pivotable speaker assembly.
Figure 2:
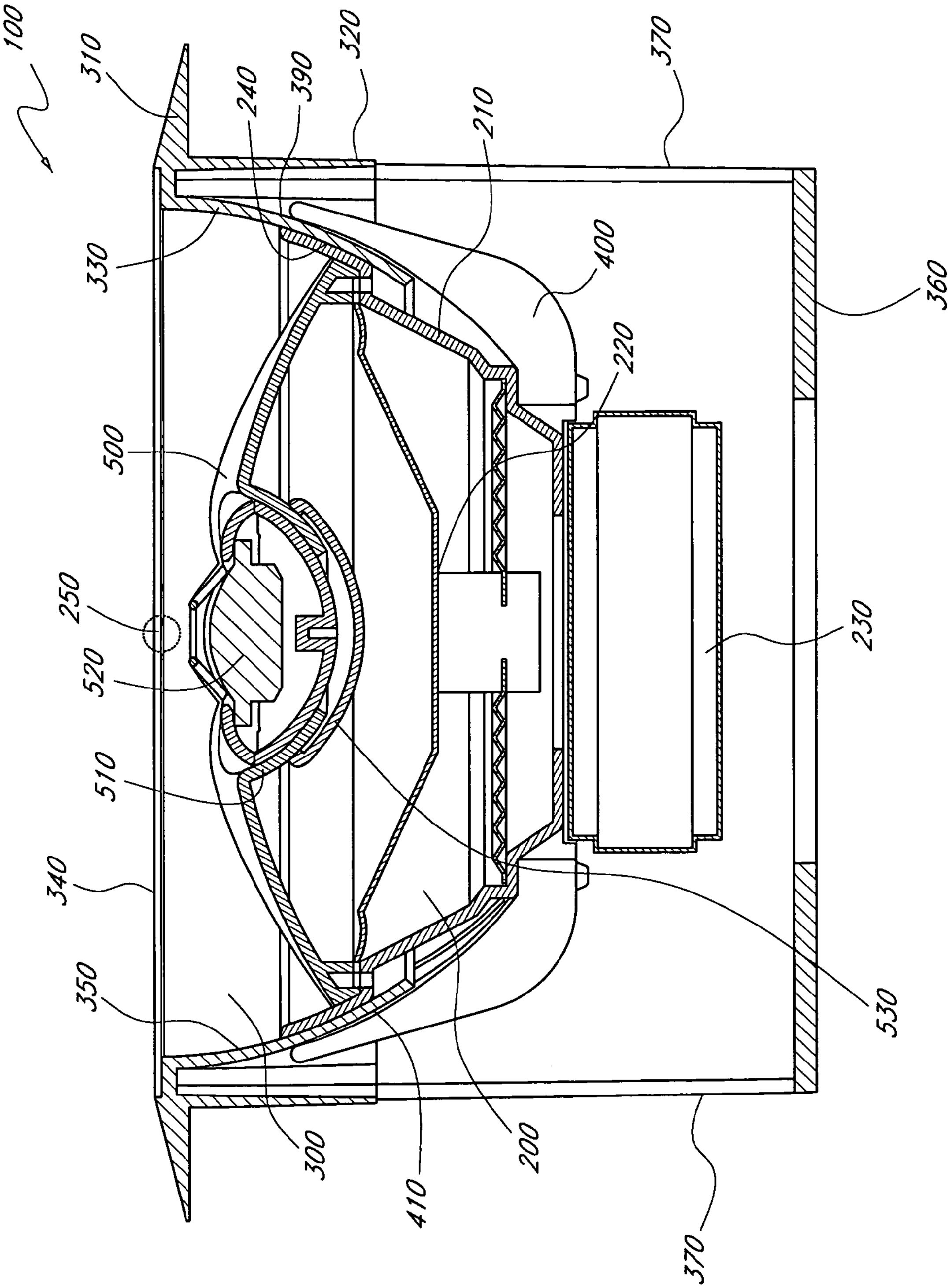
FIG. 2 is a cross-sectional view of the panel-mounted pivotable speaker assembly of FIG. 1.
Figure 3:
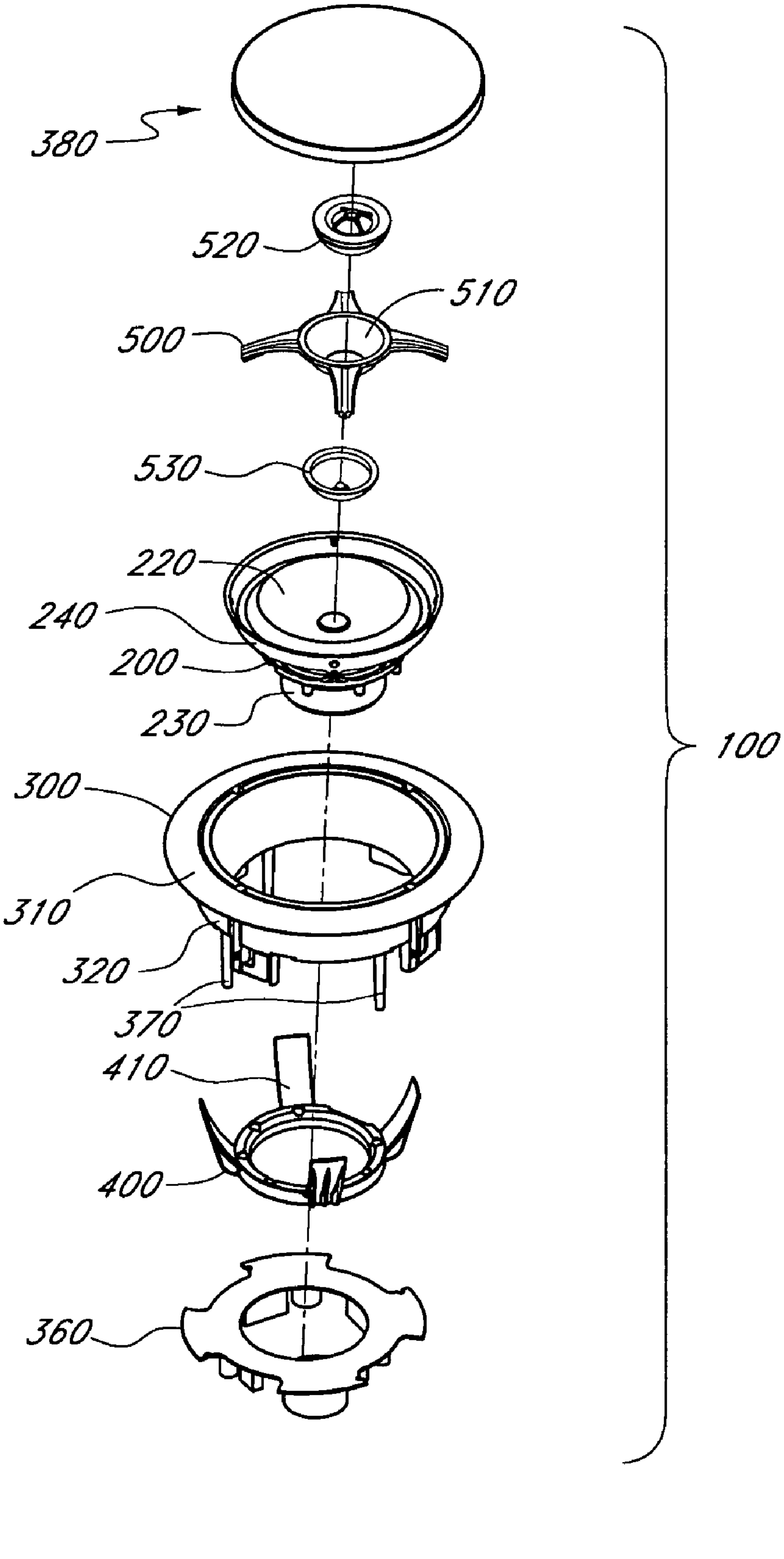
FIG. 3 is an exploded view of certain components of the panel-mounted pivotable speaker assembly of FIG. 1.

An exemplary embodiment of an improved panel-mounted pivotable speaker assembly 100 is illustrated in FIGS. 1 through 3. In particular, an exemplary speaker assembly 100 is illustrated in a perspective view in FIG. 1, in a cross-sectional view in FIG. 2, and in an exploded view in FIG. 3. In the foregoing description, the words "forward," "forwardly," and their derivatives refer to a direction in which sound propagates from the speaker assembly 100, while the words "rearward," "rearwardly," and their derivatives refer to the opposite direction.

The speaker assembly 100 can optionally be sized so as to fit between ceiling or wall studs at standard spacings. By way of example, in one embodiment the speaker assembly 100 is 9.75 inches in diameter and is 5.125 inches deep, though other dimensions can be used as well. In an exemplary embodiment, the speaker assembly 100 includes a main speaker unit 200. The example main speaker unit 200 can handle lower frequency sound reproduction, and so can act as a woofer, midrange, or combination woofer/midrange sound emitter. The main speaker unit 200 includes a speaker frame 210 having one or more speaker components mounted thereto. For example, in such embodiments, speaker components mounted to the speaker frame 210 can include a transducer element 220 (such as a speaker cone, speaker dome, speaker horn, and/or coil assembly) mounted to an upper portion of the speaker frame 210, and a stator element 230 (such as a permanent magnet) mounted to a base portion of the speaker frame 210. Additional and/or other speaker components can be mounted to the speaker frame 210 in other embodiments. The speaker components are secured to the speaker frame 210 using screws, bolts, snap fasteners, or other suitable fastening mechanisms. In an exemplary embodiment, the main speaker frame 210 is substantially circular, and includes an annular outward facing surface 240 around at least a portion of its perimeter. However, other shapes can be used as well.

In the illustrated exemplary embodiment, the speaker assembly further includes a speaker housing 300 having a substantially circular outwardly extending perimeter flange portion 310 that defines a speaker face plane 340. In such embodiments, two walls extend rearwardly from the perimeter flange portion 310. In particular, a rearwardly extending exterior wall 320 is separated from a rearwardly extending interior curved wall 330, as illustrated in FIG. 2. The interior curved wall 330 includes a concave inward facing surface 350 that extends around the speaker housing 300, and that is substantially circular. The interior curved wall 330 further includes a convex outward facing surface 390 opposite of the inward facing surface 350. The interior curved wall 330 is dimensioned such that the speaker unit 200 can be positioned into, and supported by, the speaker housing 300, with the speaker frame outward facing surface 240 engaging the speaker housing inward facing surface 350. In a modified embodiment, the rearwardly extending exterior wall 320 is omitted from the speaker housing 300.

As illustrated in FIGS. 2 and 3, in an exemplary embodiment, a speaker support member 400 is mounted to the speaker frame 210. The speaker support member 400 includes an inward facing surface 410 configured to engage the speaker housing outward facing surface 390. In one exemplary embodiment, the speaker support member 400 has a circular configuration, extending around the speaker housing interior curved wall 330. In certain example embodiments, the speaker support member 400 includes a plurality of "fingers" that extend forwardly to engage the outward facing surface 390 of the speaker housing interior curved wall 330.

Regardless of the configuration of the speaker support member 400, in the foregoing example configurations, the speaker support member inward facing surface 410 and the main speaker unit outward facing surface 240 engage opposite sides of the speaker housing interior curved wall 330, as illustrated in FIG. 2. This configuration advantageously allows the main speaker unit 200 to pivot with respect to the speaker housing 300. The speaker support member inward facing surface 410 and the main speaker unit outward facing surface 240 are optionally configured to exert a compressive force on (that is, "pinch") the speaker housing interior curved wall 330, such that the main speaker unit 200 will remain in a particular pivoted orientation once so positioned. In another embodiment, user accessible set screws, clips, and the like can be used to fix the main speaker unit 200 once the user has pivoted the speaker as desired. In such embodiments, the user can loosen or remove the set screws, clips, and the like to reposition the main speaker unit 200.

The configuration described herein allows the main speaker unit 200 to pivot about a pivot point 250 that is forward of the transducer element 220. For example, the pivot point 250 can be positioned rearward of, within, or forward of the speaker face plane 340. This positioning of the pivot point 250 advantageously causes the transducer element 220 to move up and away from the speaker housing interior curved wall 330 when the main speaker unit 200 is pivoted. This configuration reduces the magnitude of sound reflections from the speaker housing interior curved wall 330 at various pivot positions, thereby improving sound quality. In particular, the magnitude of sound reflections can be reduced as compared to those generated in a panel mounted speaker assembly wherein the pivot point 250 is positioned adjacent to or rearward of the transducer element 220.

As is evident from the illustration of the exemplary embodiment of FIG. 2, the main speaker unit 200 is configured to pivot in a partial circle around the pivot point 250. For example, in one embodiment the main speaker unit pivots in a range of ±15° from a central axis of the speaker assembly 100, in another embodiment the main speaker unit pivots in a range of ±30° from a central axis of the speaker assembly 100, in another embodiment the main speaker unit pivots in a range of ±45° from a central axis of the speaker assembly 100, and in yet another embodiment the main speaker unit pivots in a range of ±60° from a central axis of the speaker assembly 100. Other pivot ranges can be used as well.

Still referring to FIG. 2, the speaker assembly 100 optionally includes a secondary speaker support assembly 500 mounted to the speaker frame 210. As illustrated in FIG. 3, the secondary speaker support assembly 500 can be mounted to the speaker frame at a plurality of locations, such as at four locations. This configuration advantageously allows sound generated by the transducer element 220 to pass from the speaker assembly 100 without being substantially impeded by the presence of the secondary speaker support assembly 500.

In such embodiments, the secondary speaker support assembly 500 includes a support structure, which can be in the form of a recessed cradle portion 510, configured to support a secondary speaker 520 therein, such that the secondary speaker 520 can pivot within the cradle portion 510 of the support structure. By way of example, the secondary speaker 520 can be configured to handle relatively higher frequency sound reproduction, and so can act as a tweeter. Additional speakers, such as additional tweeters, can be included as well.

As illustrated in FIG. 2, the secondary speaker 520 can be secured in the cradle portion 510 of the support structure through the use of a curved support member 530 positioned opposite the cradle portion 510 of the support structure from the secondary speaker 520. In an exemplary embodiment, the secondary speaker 520 pivots about the same pivot point as the main speaker unit 200. In an exemplary embodiment, the secondary speaker 520 pivots about a secondary speaker pivot point that is stationary regardless of the position of the main speaker unit 200.

The example secondary speaker 520 is configured to pivot in a partial circle around the secondary speaker pivot point. For example, in one embodiment the secondary speaker pivots in a range of ±15° from a central axis of the secondary speaker support assembly 500, in another embodiment the secondary speaker pivots in a range of ±30° from a central axis of the secondary speaker support assembly 500, in another embodiment the secondary speaker pivots in a range of ±45° from a central axis of the secondary speaker support assembly 500, and in yet another embodiment the secondary speaker pivots in a range of ±60° from a central axis of the secondary speaker support assembly 500. Other pivot ranges can be used as well.

This example configuration allows the secondary speaker 520 to be positioned forward of the main speaker unit 200, and allows the secondary speaker 520 to be pivoted independently of the main speaker unit 200. The speaker assembly 100 optionally further comprises electronic control circuitry, including an active or passive crossover network that is configured to drive the transducer element 220 over a first frequency range, and the secondary speaker 520 over a second frequency range. In such embodiment, the second frequency range is higher than, but overlapping with, the first frequency range, the two frequency ranges overlapping at a crossover frequency. In such embodiments, wherein the main speaker unit 200 and the secondary speaker 520 are independently pivotable, the two frequency ranges can be directed to different regions of a room, for example. By way of further example, the user can choose not bother pivoting the main speaker unit 220, which may be less directional in its sound reproduction, and only pivot the secondary speaker unit 520.

Figure 4:
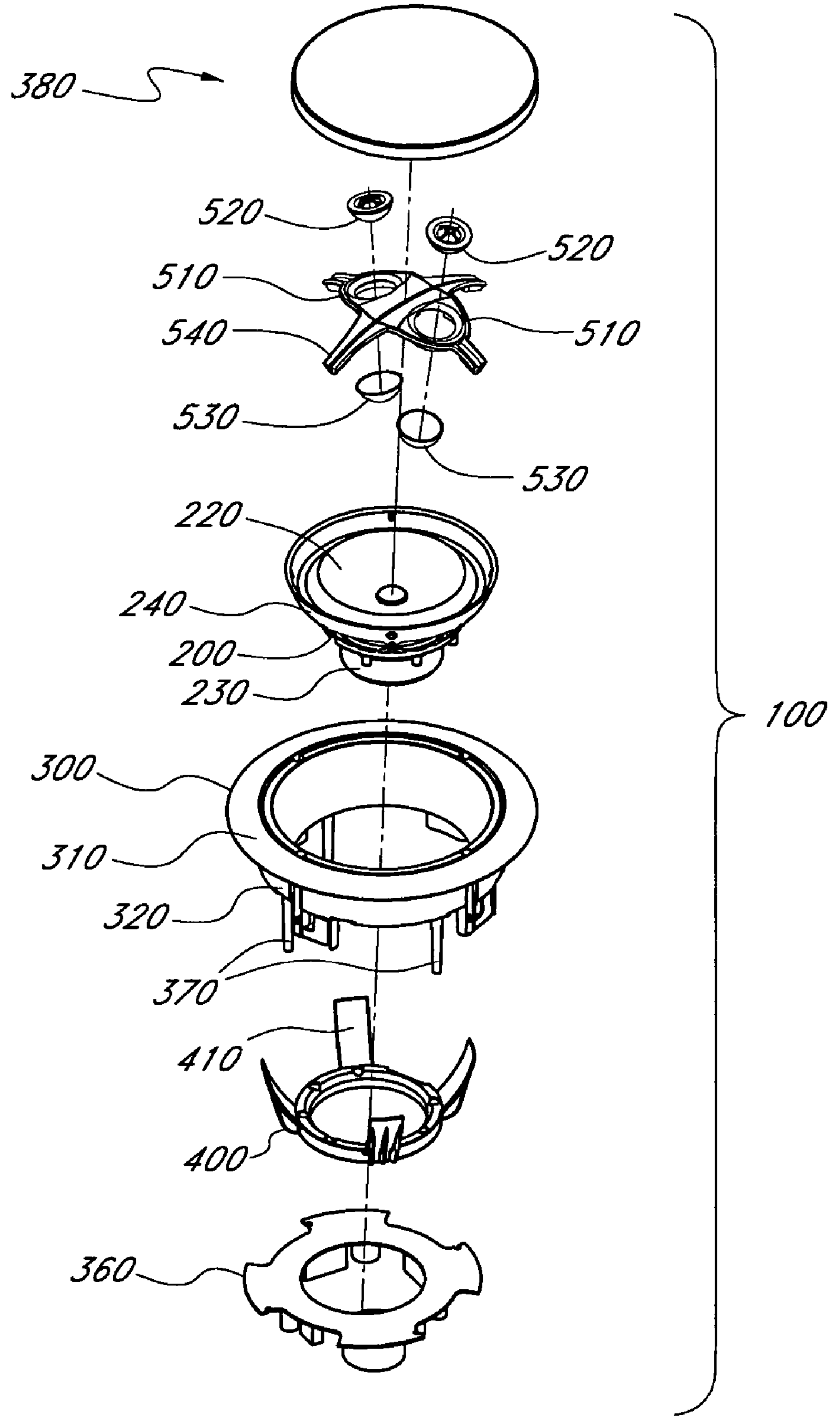
FIG. 4 is an exploded view of certain components of an exemplary panel-mounted pivotable speaker assembly having two secondary speakers.

In certain embodiments, illustrated in FIG. 4, a plurality of secondary speakers 520 are positioned forward of the main speaker unit 200. In such embodiments, a modified secondary speaker support assembly 540 is configured to support a plurality of secondary speakers 520. The secondary speakers 520 are optionally pivotable with respect to the main speaker unit, and/or with respect to each other. The secondary speakers 520 can be made pivotable within the modified support assembly 540 using a similar recessed cradle portion 510 and curved support member 530 as described previously.

As illustrated in FIG. 4, in embodiments wherein the speaker assembly 100 comprises a plurality of secondary speakers 520, the secondary speakers 520 can be positioned adjacent to each other. In such embodiments, the secondary speakers 520 can be configured to pivot about a single pivot point, which is optionally the same pivot point about which the main speaker unit 200 pivots. In other embodiments, the secondary speakers 520 can be configured to pivot about separate pivot points. In still other embodiments, the modified secondary speaker support assembly 540 can be configured to support more than two secondary speakers 520.

As illustrated in FIGS. 1 and 3, in an exemplary embodiment, the electronic control circuitry, including the crossover network, is mounted to a circuit panel 360 that is mounted to the speaker housing 300. In this example embodiment, the speaker housing 300 includes rearwardly extending circuit panel mounts 370 that are used to mount the circuit panel 360 rearward of the main speaker unit 200 in an orientation that is substantially parallel to the speaker face plane 340.

In one exemplary embodiment, the circuit panel 360 is positioned sufficiently rearwardly of the main speaker unit 200 such that no moving and/or other portion of the main speaker unit 200, or any components attached thereto as described herein, contacts the speaker panel 360 as the main speaker unit 200 is pivoted through its full range of motion. This configuration advantageously prevents other components of the speaker assembly 100, such as the stator element 230, from damaging the circuit panel 360, or electronic components mounted thereon, while being pivoted. Thus, for example, this configuration prevents the pivoting speaker from applying a force to the circuit panel 360, and from causing electronic damage thereto (such as by shorting-circuiting electronic components).

Referring again to FIGS. 1 and 3, a speaker grille 380 is optionally mounted to the speaker housing 300 adjacent the flange portion 310 and parallel to the speaker face plane 340. The speaker grille 380 can be secured to the speaker housing 300 using screws, rivets, an epoxy, or another suitable mounting mechanism. In such embodiments, the pivotable main speaker unit 200 and the pivotable secondary speaker 520 are configured to remain rearward of the speaker face plane 340 across the full pivot range of these components, thereby preventing the speaker grille 380 from impeding the pivoting of these components.

In one embodiment, the speaker grille 380 is removable from the speaker housing, thereby providing access to the pivoting speakers for adjustment. The speaker grille 380 provides an aesthetic cover for the speaker assembly 100, and also protects the speaker assembly internal components from damage which can occur from objects inserted into the speaker assembly 100. In one embodiment, the grille comprises a rigid metallic cover that is perforated, so as to allow sound to pass therethrough without significant degradation in sound quality.

The various embodiments of the speaker assembly 100 described herein can be mounted to, and recessed within a panel, such as a ceiling or wall. The pivotable design of the main speaker unit 200 and the secondary speaker 520 allow sound, including sound of specific frequency ranges, to be directed to certain portions of a room or other area. Moreover, as described above, by configuring the main speaker unit 200 to pivot about a pivot point 250 that is located forward of the transducer element 220, the magnitude of sound reflections from the speaker housing interior curved wall 320 can be reduced, thereby further enhancing sound quality.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than speaker assemblies.

I claim:

1. A pivoting panel-mount speaker assembly comprising:

a speaker housing having a perimeter flange portion and an interior curved track extending rearwardly from the perimeter flange portion, the interior curved track having an outward facing convex surface and an inward facing concave surface;

a speaker unit having a transducer element and a speaker frame supporting the transducer element, the speaker frame having an outward facing surface configured to slidably engage the inward facing concave surface of the housing interior curved track;

a speaker support member attached to the speaker unit and having an inward facing surface configured to slidably engage the outward facing convex surface of the housing interior curved track; and a circuit panel having speaker control circuitry mounted thereon, the circuit panel mounted to the speaker housing at one or more circuit panel attachment points;

wherein the speaker unit and the speaker support member are pivotable around a pivot point that is forward of the transducer element.

2. The speaker system of claim 1, wherein the speaker unit pivots within a range of approximately ±15° from a speaker central axis.

3. The speaker system of claim 1, wherein the speaker unit pivots within a range of approximately ±30° from a speaker central axis.

4. The speaker system of claim 1, wherein the speaker unit pivots within a range of approximately ±45° from a speaker central axis.

5. The speaker assembly of claim 1, wherein the circuit panel is in a substantially unloaded state except at the circuit panel attachment points.

6. The speaker assembly of claim 1, wherein the transducer element comprises a dome.

7. The speaker assembly of claim 1, wherein the transducer element comprises a cone.

8. The speaker assembly of claim 1, wherein the speaker unit does not contact the circuit panel over a full pivot range of the speaker unit.

9. The speaker assembly of claim 1, further comprising means for mounting a secondary speaker to the speaker unit, such that the secondary speaker is also pivotable around the pivot point.

10. The speaker assembly of claim 1, wherein a secondary speaker is tiltably mounted forward of the speaker unit, and wherein the secondary speaker pivots about the pivot point.

11. The speaker assembly of claim 1, wherein a secondary speaker is mounted forward of the speaker unit, and wherein the secondary speaker has a fixed orientation with respect to the main speaker unit.

12. The speaker assembly of claim 1, further comprising a protective grille structure positioned substantially parallel to the perimeter flange portion.

13. The speaker assembly of claim 1, wherein the perimeter flange portion defines a speaker face plane, and wherein the pivot point is on the speaker face plane.

14. The speaker assembly of claim 1, further comprising a cradle, wherein the cradle is configured to support a secondary speaker unit in front of the transducer, and wherein the secondary speaker unit is pivotable in the cradle.

15. The speaker assembly of claim 1, further comprising a cradle assembly, wherein:

the cradle assembly comprises a plurality of forward-projecting support arms that intersect to form a recessed portion in front of the transducer;

the cradle recessed portion is configured to support a secondary speaker; and wherein the secondary speaker unit is pivotable in the cradle recessed portion.

16. The speaker assembly of claim 1, further comprising a cradle, wherein:

the cradle is configured to support a secondary speaker unit in front of the transducer;

the secondary speaker unit is pivotable in the cradle; and the cradle is mounted to the speaker unit.

17. The speaker assembly of claim 1, further comprising a cradle, wherein the cradle is configured to support a secondary speaker unit in front of the transducer, the secondary speaker unit pivotable in the cradle, wherein the cradle remains rearward of the perimeter flange potion over the full pivot range of the speaker unit.

18. The speaker assembly of claim 1, wherein the speaker support member comprises opposing inward facing support surfaces.

19. A speaker system comprising:

a speaker support unit configured support a first speaker, the speaker support unit having an interior support member and an exterior support member, wherein the interior and exterior support members are separated by a gap;

a speaker housing having a pivot guide that is configured to be positioned in the gap between the speaker support unit interior and exterior support members, thereby allowing the speaker support unit to pivot relative to the speaker housing; and an auxiliary support structure that is mounted to the speaker support unit, and that is configured to support a second speaker that is pivotable in the auxiliary support structure, wherein the second speaker is positioned forward of the first speaker.

20. The speaker system of claim 19, wherein the speaker support unit pivots within a range of approximately ±15° from a speaker central axis.

21. The speaker system of claim 19, wherein the speaker support unit pivots within a range of approximately ±30° from a speaker central axis.

22. The speaker system of claim 19, wherein the speaker support unit pivots within a range of approximately ±45° from a speaker central axis.

23. The speaker system of claim 19, wherein:

the speaker support unit pivots about a first pivot point;

the second speaker pivots about a second pivot point; and the second pivot point remains substantially stationary when the speaker support unit pivots about the first pivot point.

24. The speaker system of claim 19, wherein the speaker support unit pivots about a pivot point that is located forward of the transducer.

25. The speaker system of claim 19, wherein the speaker support unit and the second speaker pivot about a pivot point that is located forward of the transducer.

26. The speaker system of claim 19, wherein the pivot guide comprises an interior concave annular spherical segment that is configured to slidingly engage the speaker support unit interior support member.

27. The speaker system of claim 19, wherein the curved pivot guide comprises an exterior convex annular spherical segment that slidingly engages the speaker support unit exterior support member.

28. The speaker system of claim 19, wherein the auxiliary support structure is mounted to the speaker support unit at no more than four attachment points.

29. The speaker system of claim 19, further comprising a circuit panel that is mounted to a rearwardly extending portion of the speaker housing, wherein the circuit panel has a crossover network thereon.

30. The speaker system of claim 19, further comprising a circuit panel that is mounted to a rearwardly extending exterior wall portion of the speaker housing, wherein the circuit panel has a crossover network thereon, and wherein the crossover network is configured to drive the primary speaker over a first frequency range and the auxiliary speaker over a second frequency range.

31. An apparatus comprising:

a speaker housing having a curved track with an outward facing convex surface and an inward facing concave surface;

a speaker assembly configured to support a transducer element, the speaker assembly including an outward facing surface configured to slidably engage the inward facing concave surface of the housing interior curved track; and a speaker support member attached to the speaker assembly and having an inward facing surface configured to slidably engage the outward facing convex surface of the housing interior curved track, wherein the speaker assembly and the speaker support member are pivotable around a pivot point that is forward of the transducer element.

32. The apparatus of claim 31, further comprising an auxiliary support structure that is mounted to the speaker assembly, and that is configured to support a second speaker that is pivotable in the auxiliary support structure.

33. The apparatus of claim 31, further comprising an auxiliary support structure that is mounted to the speaker assembly, and that is configured to support a second speaker in a fixed orientation with respect to the speaker assembly.

34. The apparatus of claim 31, further comprising an auxiliary support structure that is mounted to the speaker assembly, and that supports a second speaker that is pivotable in the auxiliary support structure, wherein the second speaker is also pivotable around the pivot point.

35. The apparatus of claim 31, wherein the speaker assembly further comprises a perimeter flange portion defining a speaker face plane, and wherein the pivot point is on the speaker face plane.

36. The apparatus of claim 31, further comprising a circuit panel that is mounted to a rearwardly extending portion of the speaker assembly.

37. The apparatus of claim 31, wherein the speaker assembly is further configured to support a stator element.

38. The apparatus of claim 31, wherein the speaker assembly further comprises a perimeter flange portion defining a speaker face plane, wherein the curved track extends reward from the perimeter flange.

39. The apparatus of claim 31, wherein the speaker assembly further comprises a substantially circular perimeter flange portion defining a speaker face plane, wherein the curved track extends reward from the perimeter flange.

40. A method of assembling a speaker assembly, the method comprising:

mounting a speaker support member to a main speaker unit such that a gap exists between a inward facing engagement surface of the speaker support member and an outward facing engagement surface of the main speaker unit, wherein the speaker support member supports a first speaker;

positioning a speaker housing interior curved track portion of a speaker housing into at least a portion of the gap, such that an exterior side of the curved track portion engages the inward facing engagement surface, and an interior side of the curved track portion engages the outward facing engagement surface; and mounting an auxiliary support structure to the speaker support member, the auxiliary support structure supporting a second speaker forward of the first speaker.

41. The method of claim 40, further comprising mounting a circuit panel to the speaker housing at one or more attachment points, wherein the circuit panel is in a substantially unloaded state except at the attachment points.

42. The method of claim 40, wherein the inward facing engagement surface of the speaker support member is concave.

43. The method of claim 40, wherein the outward facing engagement surface of the main speaker unit is convex.

44. An apparatus comprising:

a speaker housing having a curved track with an outward facing convex surface and an inward facing concave surface;

a speaker assembly configured to support a transducer element, the speaker assembly including an outward facing surface configured to slidably engage the inward facing concave surface of the housing interior curved track;

a speaker support member attached to the speaker assembly and having an inward facing surface configured to slidably engage the outward facing convex surface of the housing interior curved track, wherein the speaker assembly and the speaker support member are pivotable around a first pivot point that is forward of the transducer element; and an auxiliary support structure that is mounted to the speaker assembly, and that is configured to support a plurality of auxiliary speakers that are pivotable within the auxiliary support structure, wherein the auxiliary speakers are positioned forward of the transducer element.

45. The apparatus of claim 44, wherein the auxiliary support structure supports two auxiliary speakers.

46. The apparatus of claim 44, wherein the auxiliary speakers pivot about a single second pivot point.

47. The apparatus of claim 44, wherein at least one of the auxiliary speakers pivots about the first pivot point.

48. The apparatus of claim 44, further comprising a circuit panel that is mounted to a rearwardly extending portion of the speaker housing.

49. The apparatus of claim 44, further comprising:

a circuit panel that is mounted to a rearwardly extending portion of the speaker housing; and a crossover network included on the circuit panel, wherein the crossover network is configured to drive the transducer element over a first frequency range, and to drive the auxiliary speakers over a second frequency range.

50. The apparatus of claim 44, further comprising a circuit panel that is mounted to a rearwardly extending portion of the speaker housing at a plurality of attachment points, wherein the circuit panel is in a substantially unloaded state except at the attachment points.

* * * * *